United States Patent [19]
McClure et al.

[11] Patent Number: 5,099,148
[45] Date of Patent: Mar. 24, 1992

[54] INTEGRATED CIRCUIT HAVING MULTIPLE DATA OUTPUTS SHARING A RESISTOR NETWORK

[75] Inventors: David C. McClure, Carrollton; James Brady, Dallas, both of Tex.

[73] Assignee: SGS-Thomson Microelectronics, Inc., Carrollton, Tex.

[21] Appl. No.: 601,288

[22] Filed: Oct. 22, 1990

[51] Int. Cl.$^5$ .............................................. H03K 17/16
[52] U.S. Cl. ................................. 307/443; 307/202.1; 307/451; 307/475; 307/270
[58] Field of Search ...................... 307/202.1, 443, 451, 307/475, 270

[56] References Cited

U.S. PATENT DOCUMENTS

| | | | |
|---|---|---|---|
| 4,518,871 | 5/1985 | Toyoda et al. | 307/443 |
| 4,797,579 | 1/1989 | Lewis | 307/443 |
| 4,827,159 | 5/1989 | Naganuma | 307/443 |
| 4,851,714 | 7/1989 | Hwang | 307/448 |
| 4,942,309 | 7/1990 | Chieli | 307/270 |

*Primary Examiner*—Stanley D. Miller
*Assistant Examiner*—Scott A. Ouellette
*Attorney, Agent, or Firm*—Rodney M. Anderson; Richard K. Robinson; Lisa K. Jorgenson

[57] ABSTRACT

An output driver arrangement for an integrated circuit having multiple output terminals is disclosed. Each of the output drivers is a push-pull driver, with the gates of the pull-up and pull-down transistors each controlled by a logic circuit; the logic circuits perform a logical combination of the data to be presented and an output disable signal. In order to control the switching speed of the outputs, and thus to reduce induced noise, each of the logic circuits share a resistor network at their bias nodes. For example, each of the logic circuits controlling the pull-up device share a resistor network for bias from $V_{cc}$, and a resistor network for bias to ground; similarly, each of the logic circuits controlling the pull-down device share a resistor network for bias from $V_{cc}$ and a resistor network for bias to ground. Various arrangements including fuses may be used to allow selection of the resistance value of each of the networks, according to the performance of the circuit or in response to product demand.

29 Claims, 3 Drawing Sheets

INTEGRATED CIRCUIT HAVING MULTIPLE DATA OUTPUTS SHARING A RESISTOR NETWORK

This invention is in the field of integrated circuits, and is more particularly directed to output drivers in such circuits.

BACKGROUND OF THE INVENTION

Many conventional integrated circuits include multiple output terminals for communicating the result of internal calculations or other operations, by way of a data word consisting of multiple binary digits ("bits") presented in parallel. Examples of such circuits include microprocessors and other logic integrated circuits which perform arithmetic computations or logical combinations upon digital data, memory devices which store digital data, interface circuits such as analog-to-digital converters, and other well known classes of integrated circuits. Improvements in the performance of such integrated circuits, particularly the speed at which the circuit can perform its intended function and provide the correct result, are of course desirable and are being achieved in this field.

As is well known in this field, the ability of the output terminals to switch from one logic state to another is a significant factor in the performance of the integrated circuit, especially for those circuits which must drive loads having significant impedance (e.g., TTL loads); the impedance of such loads is generally dominated by resistive and capacitive components. In order to quickly charge up the capacitance of the load, whether the load is another integrated circuit, a transmission line, or both, the integrated circuit must be capable of providing relatively large amounts of current (on the order of milliamperes) over short periods of time (on the order of nanoseconds), in order to meet modern performance requirements.

The integrated circuits, the physical terminals connected thereto, as well as the printed circuit board lines and other conductors to which the integrated circuit terminals are connected, necessarily include parasitic inductance. Due to the presence of the parasitic inductance, together with the large amounts of instantaneous current supplied over short periods of time, noise is generated at the outputs of the integrated circuits having a magnitude equal to the product of the inductance and the rate of change of the current (i.e., $dv = Ldi/dt$). As the performance of the circuits is enhanced so that the switching times are reduced, for the same load current requirements and the same parasitic inductance, the induced noise at the outputs necessarily increases.

Furthermore, a trend is continuing where integrated circuits such as microprocessors and memories are presenting wider data words, i.e., more bits, at their outputs. Considering the amount of induced noise for switching times of less than five nanoseconds at load specifications which require milliamps of current, and especially considering the simultaneous switching of from eight to thirty-two outputs, the amount of noise generated by modern integrated circuits can be significant in the system environment. Such noise can not only adversely affect the operation of other integrated circuits in the system, for example by causing false data states to be detected, but may also be of sufficient magnitude as to upset the integrated circuit itself cause erroneous internal operation.

To combat the problem of switching noise generated at the outputs of integrated circuits, a prior technique includes series resistors in the output buffer circuits to control the slew rate at which the output drivers turn on and off. Referring to FIG. 1, conventional output buffer circuits $10_0$ and $10_1$ for driving output terminals $D_0$ and $D_1$, respectively, are shown. Output buffer circuits $10_0$ and $10_1$ receive data input lines $IN_0$ and $IN_1$, respectively. Each of output buffer circuits $10_0$ and $10_1$ also receive output disable line DIS, and inverted output disable line DIS_ generated by inverter 11 inverting the state of line DIS. Output disable line DIS is generated by control circuitry in the integrated circuit containing output buffers 10, in the conventional manner. Output buffers 10 each will present a high impedance condition at their respective D terminals responsive to line DIS being at a high logic level.

Of course, the number of output terminals D can number as many as thirty-two or sixty-four for a single integrated circuit. For purposes of clarity and ease of description, only the two output buffers $10_0$ and $10_1$ are shown in FIG. 1 and will be described herein.

Each output buffer 10 includes a push-pull driver for driving its respective output terminal D. In this example, referring to output buffer $10_0$ by way of example, a CMOS push-pull driver is used which consists of p-channel pull-up transistor $12_0$ with its source connected to $V_{cc}$, and n-channel pull-down transistor $14_0$ having its source connected to ground. The drains of transistors $12_0$ and $14_0$ are connected together, and drive the associated output terminal $D_0$. It should be noted that electrostatic discharge protection devices may be provided between $V_{cc}$ and terminal $D_0$, and between ground and terminal $D_0$, in parallel with transistors $12_0$ and $14_0$, respectively, in the conventional manner. The gate of pull-up transistor $12_0$ is controlled by the output of NAND function $20_0$, and the gate of pull-down transistor $14_0$ is controlled by the output of NOR function $22_0$. The inputs to NAND $20_0$ are data input line $IN_0$ and inverted output disable line DIS_; NOR $22_0$ receives data input line $IN_0$ and output disable line DIS at its inputs.

The construction of NAND $20_0$ and of NOR $22_0$ in this example of output buffer $10_0$ is according to conventional designs for CMOS NAND and NOR functions, as are well known in the art. Accordingly, NAND $20_0$ is constructed with p-channel transistors 16 having their source-drain paths connected in parallel with one another between node $PNAND_0$ and the gate of transistor $12_0$ (i.e., the output of NAND $20_0$), with one of transistors 16 having its gate connected to data input line $IN_0$ and the other of transistors 16 having its gate connected to inverted output disable line DIS_. NAND $20_0$ further includes n-channel transistors 18 having their source-drain paths connected in series between node $GNAND_0$ and the gate of transistor $12_0$; one of transistors 18 has its gate connected to data input line $IN_0$ and the other of transistors 18 has its gate connected to inverted output disable line DIS_. Node $PNAND_0$ is biased to $V_{cc}$ through resistor $R1_0$, and node $GNAND_0$ is biased to ground through resistor $R2_0$. Accordingly, NAND $20_0$ performs the logical NAND of data input line $IN_0$ and inverted output disable line DIS_.

Similarly, NOR $22_0$ is constructed as a conventional CMOS two-input NOR gate, with the inputs thereto being data input line $IN_0$ and disable line DIS. NOR $22_0$ includes p-channel transistors 17 having their source-drain paths connected in series between node $PNOR_0$ and the gate of transistor $17_0$; one of transistors 17 has its gate connected to data input line $IN_0$ and the other of transistors 17 has its gate connected to disable line DIS. N-channel transistors 19 have their source-drain paths connected in parallel between node $GNOR_0$ and the gate of transistor $14_0$; one of transistors 19 receives data input line $IN_0$ at its gate, and the other of transistors 19 receives disable line DIS at its gate. Node $PNOR_0$ is biased to $V_{cc}$ through resistor $R3_0$, and node $GNOR_0$ is biased to ground through resistor $R4_0$. Accordingly, NOR $22_0$ presents the logical NOR of data input line $IN_0$ and output disable line DIS at its output, to the gate of transistor $14_0$.

In operation, when enabled by line DIS being at a low logic level and line DIS_ being at a high logic level, NAND $20_0$ will present the complement of data input line $IN_0$ to the gate of pull-up transistor $12_0$, and NOR $22_0$ will present the complement of data input line $IN_0$ to the gate of pull-down transistor $14_0$. Since transistor $12_0$ is p-channel, and since transistor $14_0$ is n-channel, a high logic level on data input line $IN_0$ will cause transistor $12_0$ to be on and transistor $14_0$ to be off, such that a high logic level will appear at terminal $D_0$. Conversely, a low logic level on data input line $IN_0$ will cause transistor $12_0$ to be off and transistor $14_0$ to be on, presenting a low logic level at terminal $D_0$. If output disable line DIS is at a high logic level (and inverted output disable line DIS_ thus at a low logic level), both of transistors $12_0$ and $14_0$ will be off, presenting a high impedance state at terminal $D_0$.

Output buffer $10_1$ of FIG. 1 is, of course, constructed similarly as output buffer $10_0$. Output buffer $10_1$ operates in a similar manner to present a data state at terminal $D_1$ according to the data state of data input line $IN_1$, when enabled, and to present a high impedance state thereat responsive to output disable line DIS being at a high logic level. For ease of illustration, NAND function $20_1$ and NOR function $22_1$ are shown in FIG. 2 in conventional logic gate form; however, as shown in FIG. 2, NAND $22_1$ is biased through its associated resistors $R1_1$ and $R2_1$, and NOR $22_1$ is biased through its associated resistors $R3_1$ and $R4_1$.

The purpose of resistors R1 through R4 for each of output buffers 10 in the conventional arrangement of FIG. 1 is for purposes of controlling the switching rate of output buffers 10, and limiting the noise generated at the output terminals D. Referring to NAND $20_0$ for example, the speed at which either of p-channel transistors 16 can pull up the gate of transistor $12_0$ toward $V_{cc}$ (responsive to either of data input lines $IN_0$ or inverted output disable line DIS_ being low) will decrease with larger values of resistance for resistor $R1_0$, and will increase with smaller values of resistance for resistor $R1_0$. Similarly, the speed at which n-channel transistors 18 can discharge the gate of transistor $12_0$ to ground (responsive to both of data input lines $IN_0$ and inverted output disable line DIS_ being high) will decrease with larger resistance values of resistor $R2_0$ and increase with smaller resistance values for resistor $R2_0$.

Accordingly, in this conventional arrangement, the resistance values of resistors R1 through R4 can be selected, for each of output buffers 10, to control the speed at which terminals D switch state, and thus control the Ldi/dt noise generated thereby. A further benefit of reducing the switching speed of the NANDs 20 and NORs 22 is that crowbar current through the push-pull transistors 12 and 14 can be avoided, for example by selecting the resistor values R1 through R4 so that each of the transistors 12 and 14 turn on slowly, but turn off quickly. To achieve this, resistors R1 and R4 would have relatively low resistance, and that resistors R2 and R3 would have relatively high resistance. This control of the Ldi/dt noise, and minimization of crowbar current by use of resistors R1 through R4 will, of course, require trade-off with reduced switching speed of output terminals D. Selection of the resistor values have been made, according to these parameters, by circuit designers in the art.

This conventional configuration of output buffers 10 as shown in FIG. 1 requires four resistors R1 through R4 for each output buffer 10. For those devices which have eight or more output terminals, thirty-two resistors are thus required. In the manufacture of modern integrated circuits, resistors which are formed in polysilicon or in diffused regions can consume significant chip area. This is especially the case where the material which is preferred for the resistors, for example polysilicon, has relatively high conductivity. Accordingly, in the conventional configuration of FIG. 1, either significant chip surface area is consumed to provide resistors R1 through R4 for each output buffer 10, or the manufacturing process must be made significantly more complex in order to provide material of the appropriate low conductivity so that resistors R1 through R4 for each output buffer 10 can be realized in reduced chip area.

It is therefore an object of this invention to provide a output buffer circuit which provides reduced noise at the outputs for multiple output buffers in reduced chip area from that of the prior art.

It is a further object of this invention to provide such a circuit incorporating resistors having improved matching with transistors in the integrated circuit.

It is a further object of this invention to provide such a circuit where the resistor material is of relatively high conductivity.

It is a further object of this invention to provide such a circuit where the current through the resistors is limited, for improved reliability.

It is a further object of this invention to provide such a circuit having selectable resistance values to allow minimizing output switching noise based on circuit speed.

Other objects and advantages of the invention will be apparent to those of ordinary skill in the art having reference to the following specification together with the drawings.

SUMMARY OF THE INVENTION

The invention may be incorporated into the output circuitry of an integrated circuit, particularly relative to logic circuitry controlling the gates of the output driver transistors. The output drive transistors in this output circuitry are driven by a logic function of the data state, together with a control signal; the logic function is biased by the $V_{cc}$ power supply and by ground. A shared resistor network is provided in each biasing leg of the logic circuitry for multiple output drivers. The shared resistor network may be incorporated in reduced chip area relative to individual resistors for each output driver. The reduction in chip area allows for the resistor material to be fabricated on the same level as the transistor gates, even where the gate material is of relatively high conductivity, such as silicide-clad polysilicon. The resistor network may be a single resistor, or multiple resistors in parallel so that the current is limited through each resistor. The network may also include series legs which may be shorted out, either by metal lines or via fuses, so that the resistance of the network may be adjusted for individual device designs, or for individual devices.

DETAILED DESCRIPTION OF THE PREFERRED EMBODIMENT

Figure 1:
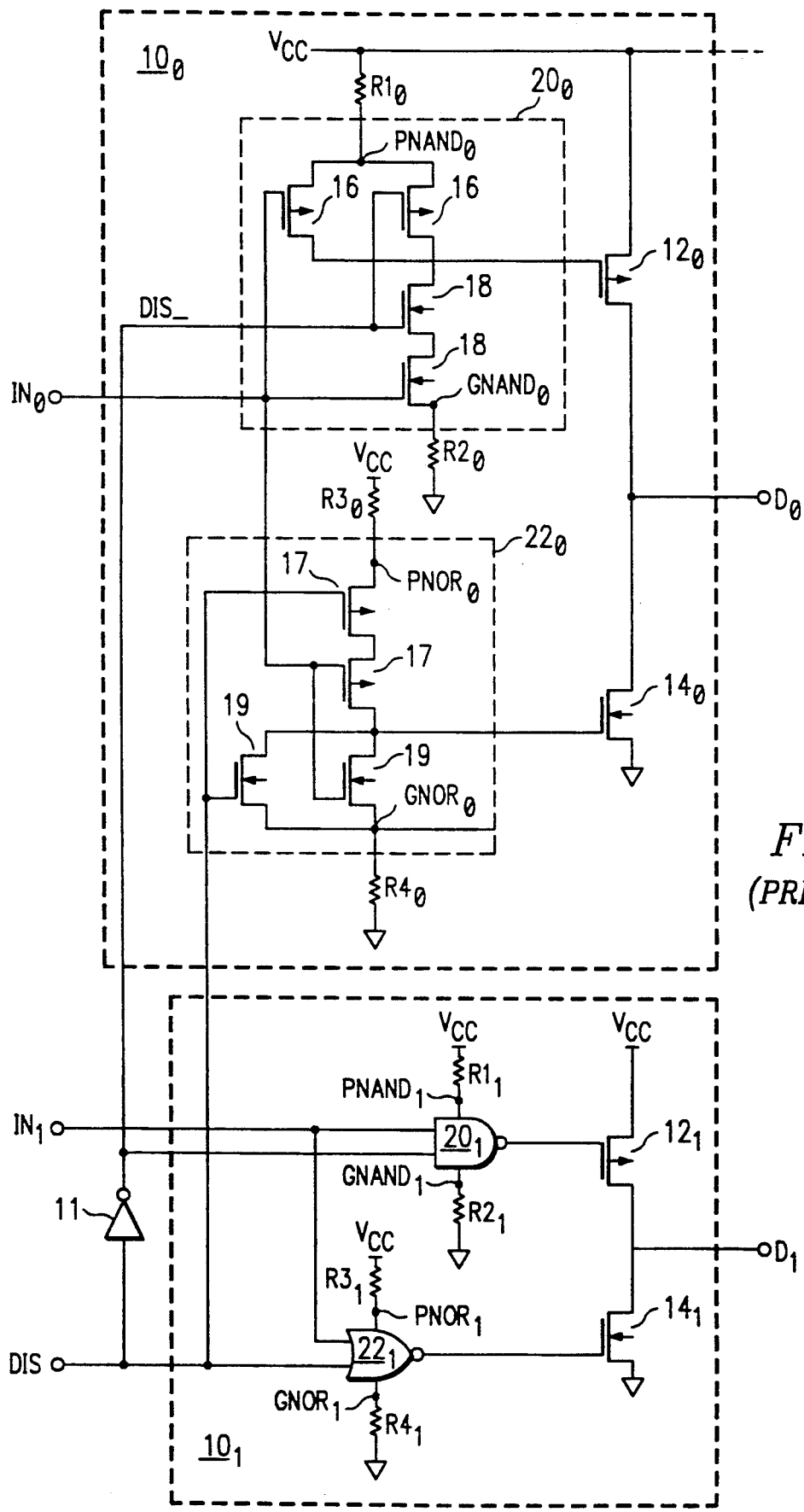
FIG. 1 is an electrical diagram, in schematic form, of a conventional output buffer arrangement.
Figure 2:
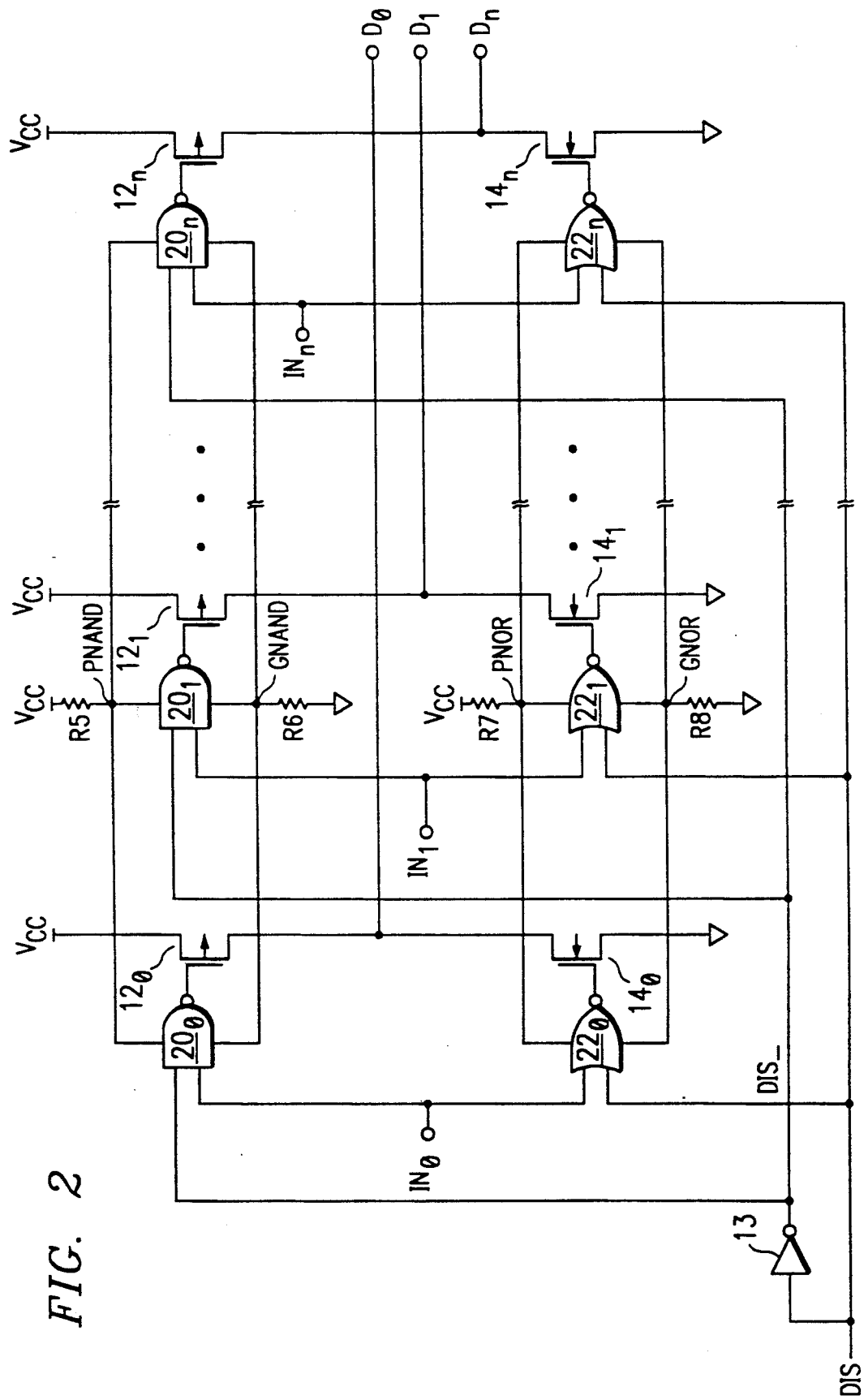
FIG. 2 is an electrical diagram, in schematic form, of an output buffer arrangement according to the preferred embodiment of the invention.

Referring now to FIG. 2, circuitry according to the preferred embodiment of the invention will now be described in detail. Those elements and components incorporated within the embodiment of FIG. 2 which are common to those in the conventional circuitry of FIG. 1 are referred to by the same reference numerals and characters.

The output drive circuitry of FIG. 2 is illustrated for multiple bit wide output from an integrated circuit. Accordingly, NAND functions $20_0$ through $20_n$ are illustrated, each driving with its output the gate of an associated p-channel pull-up transistor $12_0$ through $12_n$, connected to drive terminals $D_0$ through $D_n$, respectively. Similarly, NOR functions $22_0$ through $22_n$ each drive the gate of an associated n-channel pull-down transistor $14_0$ through $14_n$. Each of pull-up transistors $12_0$ through $12_n$ are associated in push-pull driver fashion with a pull-down transistor $14_0$ through $14_n$, respectively, for driving an associated data output terminal $D_0$ through $D_n$. As in the circuitry of FIG. 1, electrostatic discharge protection devices may be provided between $V_{cc}$ and terminal $D_0$, and between ground and terminal $D_0$, in parallel with transistors $12_0$ and $14_0$, respectively, in the conventional manner.

As in the arrangement of FIG. 1 each NAND function 20 receives at its inputs an associated input data line IN and inverted output disable line DIS_; similarly, each NOR function 22 receives at its inputs an associated input data line IN and output disable line DIS. In contrast to the circuitry of FIG. 1, however, each of NAND functions 20 have their $V_{cc}$ bias node connected in common with the other NAND functions 20 at node PNAND, and their ground bias node also connected in common with the other NAND functions 20 at node GNAND. Each of NOR functions 22 similarly have their $V_{cc}$ bias nodes connected in common at node PNOR, and their ground bias nodes connected in common at node GNOR. Node PNAND is biased for all NAND functions 20 in FIG. 2 from $V_{cc}$ through a shared resistor network R5, and node GNAND is biased for all NAND functions 20 to ground through a shared resistor network R6. Similarly, all NOR functions 22 are biased from $V_{cc}$ through a shared resistor network R7 connecting common node PNOR to $V_{cc}$, while all NOR functions 22 receive their ground bias through a common resistor network R8 connected between ground and node GNOR.

It should be noted that the particular resistance value selected for networks R5 through R8 will depend upon the switching speed of the output drivers, the parasitic inductance of the outputs and terminals, and will be selected by the designer according to the particular circuit constraints. By way of example, a particular implementation of the preferred embodiment of the invention, for transistors having channel lengths on the order of 0.8 microns (and thus having relatively high switching speed), includes a resistance value for network R5 on the order of 32 ohms, a resistance value for network R6 on the order of 75 ohms, a resistance value for network R7 on the order of 500 ohms, and a resistance value for network R8 on the order of 12.5 ohms. As noted hereinabove, the values are selected contemplating that it is desirable to avoid crowbar current by turning off driver transistors 12 and 14 more quickly than they are turned on, hence the resistance of network R5 is lower than network R6, and the resistance of network R8 is lower than that of network R7. Furthermore, the value of network R7 is higher than that of network R6, due to the faster turn-on time of n-channel transistors 14 relative to p-channel transistors 12.

The shared resistor networks R5 through R8, in contrast to individual resistors R1 through R4 for each output driver 10 of FIG. 1 provides the same control of the switching speed of NANDs 20 and NORs 22, and accordingly of drive transistors 12 and 14, as in the conventional circuitry discussed above relative to FIG. 1. However, the number of resistors is much reduced, from four resistors per output driver 10 in the arrangement of FIG. 1 to a minimum of four resistors total in circuitry of FIG. 2 (in the case where each resistor network R5 through R8 consists of single resistors). For an eight-bit wide output, this reduces the number of resistors from thirty-two to four; wider output circuits will achieve even greater reduction in the number of resistors to be provided.

It should be noted that not all outputs must necessarily share the same resistor network in order for the benefits of the invention to be obtained. For example, due to layout constraints, or for those resistor networks having such low resistance that the resistance of the bus lines connecting all outputs to the resistor network is significant relative to the resistance of the shared resistor network, it may be preferred to split the sharing of the resistor networks; for the example of an eight-bit wide output, four of the outputs may share the same resistor networks with the other four outputs sharing another set of resistor networks. In addition, it should be noted that it may be preferable, for some implementations, that all of the outputs may share one or more resistor networks (e.g., network R7), with other of the resistor networks shared by subsets of the outputs (e.g., the circuit may have two networks R8, each shared by four outputs). It is contemplated that other alternative arrangements will now be apparent to one of ordinary skill in the art having reference to this specification.

Figure 3:
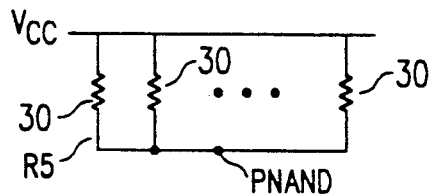
FIGS. 3, 4 and 5 are electrical diagrams, in schematic form, of alternative embodiments for the resistor networks in the preferred embodiment of FIG. 2.
Figure 4:
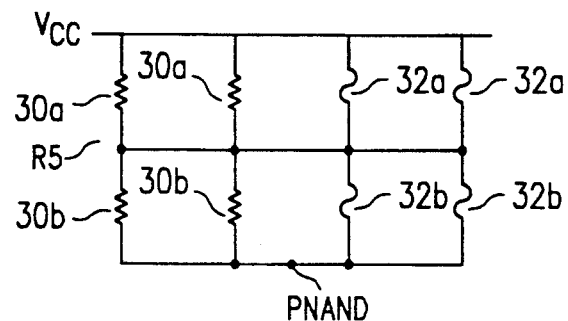
Figure 5:
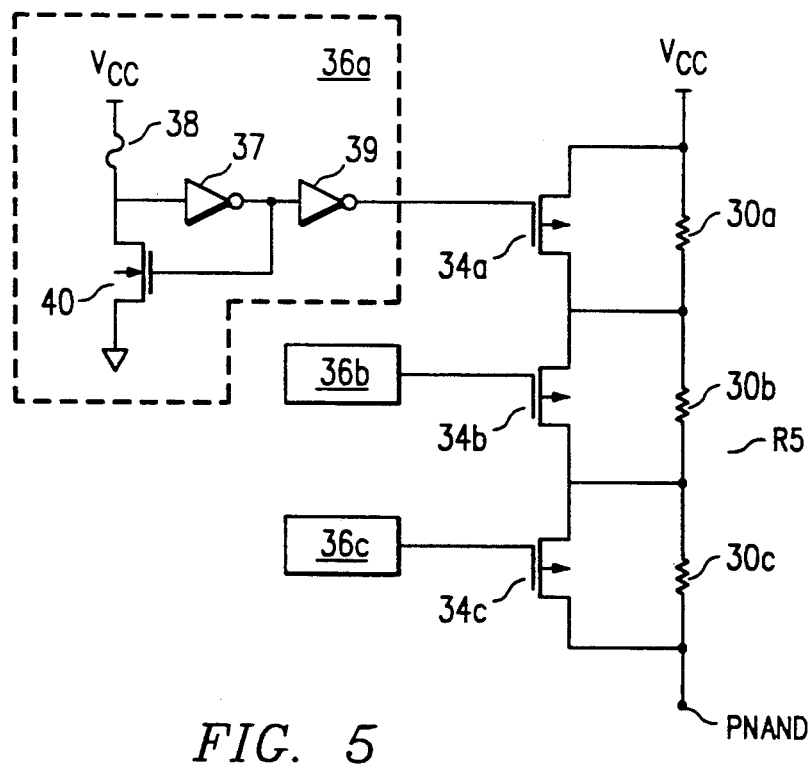

It is desirable that the resistors in resistor networks R5 through R8 (which are hereinafter sometimes referred to as resistors R5 through R8, it being understood that the networks R5 through R8 may be formed as single resistors, as suggested in FIG. 2, or by multiple resistors, for example as shown in FIGS. 3 through 5 discussed hereinbelow) be formed from the same material as the gates of transistors 12 and 14, as well as the transistors 16, 17, 18 and 19 in NAND functions 20 and NOR functions 22. This fabrication compensates for variation in the manufacturing process by allowing the resistor values to track the channel length of the transistors, providing additional noise reduction when required. Accordingly, the preferred material for resistors R5 through R8 is polycrystalline silicon for those integrated circuits using polycrystalline silicon gate material, as is generally the case in modern high-performance integrated circuits.

In the self-aligned polysilicon gate process conventionally used in modern integrated circuits, the width of the polysilicon line at the gate location directly defines the channel length of the transistor being formed due to the self-aligned formation of source and drain regions on either side thereof. As is well known, if the polysilicon line used to form the transistor gates decreases in width, the channel length of the transistor decreases, and the switching speed of the transistor increases; conversely, as the polysilicon line increases in width, the transistor channel length increases and the switching speed of the transistor will decrease.

In the preferred embodiment of FIG. 2, the resistors R5 through R8 are formed of the same polysilicon layer as the transistor gates, and formed to have nominally the same width as the polysilicon lines forming the transistor gates. For example, if the width of the polysilicon lines forming the transistor gates is nominally at 0.8 microns, the width of the polysilicon lines forming resistors R5 through R8 is preferably also nominally 0.8 microns. With such construction, the width of the resistors R5 through R8 will vary directly with the width of the polysilicon line forming the transistor gates. If, for example, the polysilicon lines forming the gates of transistors 12, 14, 16, 17, 18, and 19, are overetched so that a 0.2 micron width reduction results, the same 0.2 micron width reduction will occur for the polysilicon forming resistors R5 through R8.

Since the resistance value of resistors R5 through R8 increases with reduction in cross-sectional area of the polysilicon line, the resistance value of resistor networks R5 through R8 will increase along with the equivalent line width reduction reducing the channel length of the transistors and increasing their switching speed. Since higher value resistors in networks R5 through R8 will slow the switching speed of NANDs 20 and NORs 22, the increase in resistance will compensate for the decrease in channel length. Similarly, if underetch occurs such that the channel length of the transistors is longer due to wider polysilicon gate lines, the cross-sectional area of the polysilicon resistors in networks R5 through R8 will increase, reducing the resistance and compensating for speed loss due to longer channel length transistors. The preferred embodiment of the invention thus not only provides reduced chip area due to the shared resistor networks R5 through R8, but provides this benefit in a manner which is self-compensating for processing changes in the fabrication of the transistors.

It should be noted that the sharing of resistor networks R5 through R8 enables the resistors therein to be fabricated from the same relatively high conductivity material, such as polysilicon, which is used for the transistor gates. This is especially important where the transistor gate material is clad with a metal silicide, such as titanium silicide, cobalt silicide, tungsten silicide, platinum silicide, and the like. As is well known in the art, such silicide cladding is used to reduce the resistivity of polysilicon lines (as well as diffused regions), which is especially important as the line widths of such structures becomes smaller, for example less than a micron. The resistivity of such silicided polysilicon in generally less than 10 ohms/square, for example on the order of three ohms/square.

It should be noted that in the conventional circuitry of FIG. 1, where each NAND 20 and NOR 22 had its own resistor R1 through R4, the significant chip area required for fabrication of these numerous resistors strongly discouraged the use of high conductivity material (i.e. the same material as used for the transistor gates) for the resistors R1 through R4. Accordingly, it was very costly, from the standpoint of chip area, to provide for the benefits described above for the instant invention, in the conventional circuitry of FIG. 1.

Another advantage also results from the use of shared resistor networks R5 through R8 in the output driver circuitry of FIG. 2. In the example of an eight-bit wide output integrated circuit (i.e., n=7 in FIG. 2) where, for example, eight NANDs 20 share resistor network R5, the maximum current conducted by network R5 is eight times that which is conducted by the single resistor R1 in the circuitry of FIG. 1. Accordingly, the resistance value of the resistor network R5 may be one-eighth the value of the individual resistor R1 of FIG. 1 to arrive at the same voltage drop thereacross. Therefore, in the example of the eight-bit wide output, the shared resistor network R5 not only reduces the number of resistors by one-eighth, but also reduces the length of the resistor by one-eighth due to the lower value allowable. Accordingly, the circuit of FIG. 2 which utilizes shared resistor networks R5 through R8 provides for a sixty-four times reduction in the chip area relative to the chip area of resistors R1 through R4 of FIG. 1, if the same material of the same width were used for the fabrication thereof. Alternatively, if the gate material of the transistors were to be used for resistors R1 through R4, the configuration of FIG. 2 provides the compensation effects and ease of processing which results from using the same material for the resistors as for the gates of the transistors.

Referring now to FIG. 3, a first alternative embodiment for resistor network R5 is schematically illustrated. While the construction shown in FIG. 3 is for network R5, it is contemplated that similar construction may be used for all of networks R5 through R8; network R5 is illustrated in FIG. 3 by way of example only. Network R5 of FIG. 3 consists of individual resistors 30 connected in parallel between $V_{cc}$ and node PNAND. Each of resistors 30 is substantially identically fabricated; for example, resistors 30 may each be a polysilicon resistor, optionally clad with a metal silicide, as described hereinabove. Preferably each of resistors 30 in network R5 has the same resistance value so that the current drawn from $V_{cc}$ to node PNAND is equally distributed among the parallel resistors 30.

The parallel configuration of resistors 30 is preferred where the current requirements exceed that dictated by reliability requirements for the particular technology used in the fabrication of resistors 30. Excessive current density through integrated circuit resistor elements can cause such failure mechanisms as migration of the metal making contact to each end of the resistor which shorts out the resistor, or as the opening of the polysilicon resistor body itself in similar manner as a conventional fusible link. For example, the current limit for a silicide-clad polysilicon resistor having 0.8 micron width, and having aluminum contacts thereto at each end thereof in the conventional manner, may be on the order of 10 milliamps. Accordingly, based on the resistance value desired to control the Ldi/dt noise described hereinabove, and the current drawn by the NAND functions 20 or NOR functions 22 in circuit operation, as may be determined by simulation, multiple parallel resistors 30 in network R5 (and similarly networks R6 through R8) are preferably provided so that the current limit is not exceeded for any one of resistors 30. Rudimentary circuit analysis techniques may be used, of course, to determine the number and value of each resistor 30 in the parallel network.

The number of parallel resistors 30 will likely be different for each of networks R5 through R8 in the circuitry of FIG. 2, based on the expected current drawn through each. In the example described hereinabove, using 0.8 micron polysilicon resistors, each clad with metal silicide to result in a resistivity of 3.7 ohms/-square, network R5 includes four 100 ohm resistors 30 in parallel, network R6 includes two 125 ohm resistors 30 in parallel, network R7 includes a single 500 ohm resistor, and network R8 includes six 75 ohm resistors 30 in parallel.

Referring now to FIG. 4, another alternative embodiment of resistor network R5 (by way of example, as networks R6 through R8 may be similarly constructed) is shown. In resistor network R5 of FIG. 4, parallel resistors 30a and 30b are provided in two groups connected in series between $V_{cc}$ and node PNAND. In parallel with resistors 30a and 30b are groups of parallel fuses 32a and 32b, respectively. Fuses 32, when conductive, short out their associated resistors 30 which are connected in parallel therewith; conversely, when fuses 32 are opened, their associated resistors 30 conduct the current required between $V_{cc}$ and node PNAND.

Fuses 32 are conventional fuses as are used in integrated circuits, for example for purposes of programming logic devices, for enabling redundant rows and columns in memory devices, and for other various functions. Types of conventional fuses include polysilicon fuses which are opened by way of a laser beam, fusible links such as are used in PLA or PROM devices which are opened by way of passing high current therethrough, and the like. In addition, while fuses 32 are shown and described herein, conventional antifuses may alternative be used in place of fuses 32.

It should be noted that fuses 32 are provided in parallel with one another, as well as in parallel with their associated resistors 30. This parallel construction is preferred for those applications in which the current density is sufficiently high that a single fuse would eventually open, or otherwise fail, if it were required to conduct all of the current drawn when its associated resistor 30 is shorted out thereby. While fuses 32 are shown in parallel in FIG. 4, it is of course contemplated that a single fuse 32, in parallel with a single resistor 30, may be sufficient for many applications.

The purpose of fuses 32 are, of course, to allow selective shorting out of their associated resistors 30, after the integrated circuit according to the invention has been fabricated. The use of fuses 32 thus allows selection of the resistance values of resistor networks R5 through R8, so that the speed of the associated output driver circuitry can be optimized relative to the amount of output driver noise that can be tolerated. For example, in the production of integrated circuits including the output driver circuitry of this embodiment of the invention, the demand for slower specification integrated circuits may be high relative to the demand for high speed circuits; for such slower specification circuits, where the speed at which the outputs switch is not critical, it is desired that the output driver circuitry of FIG. 2 be constructed to reduce the Ldi/dt noise as much as possible. Accordingly, in the manufacture of those circuits which are to meet the slower specification, all fuses 32 may be blown by way of the appropriate mechanism, so that all of resistors 30a and 30b in the configuration of FIG. 4 will carry the current between $V_{cc}$ and node PNAND. Preferably, resistor networks R6 through R8 are similarly constructed as shown in FIG. 4, with the fuses 32 therein blown in similar fashion. Accordingly, with the maximum values of resistance for resistor networks R5 through R8 enabled by the blowing of the fuses 32, the speed at which NANDs 20 and NORs 22 switch is reduced, and the Ldi/dt noise generated from such switching is also reduced.

Conversely, for circuits manufactured according to the fastest specification, all of fuses 32 may be left intact, maximizing the speed at which NANDs 20 and NORs 22 switch to provide the fastest switching rate at terminals D, at a cost of higher Ldi/dt noise. Of course, in the arrangement of FIG. 4 where series groups of fuses 32a and 32b are shown, the trade-off of switching speed and noise can be set somewhere in between the extremes by opening only one of the groups of fuses 32a or 32b, and leaving the other intact, so that only one set of parallel resistors 30a or 30b conduct the current between $V_{cc}$ and node PNAND. It should be noted that it is preferred, for the example of FIG. 4 where fuses 32a and 32b are in parallel, that all fuses 32a or 32b in the group be opened as a group, rather than individual ones of fuses 32, so that the reliability of the networks R5 through R8 is maintained.

In addition, other factors may be used to determine which fuses 32 are opened and which are maintained as shorting out resistors 30. For example, actual measurement of the performance of the circuit may be used to determine if the circuit is capable of meeting higher speed specification values. For such higher speed circuits, the fuses 32 may be left intact so that the circuits may achieve the highest speed possible. Conversely, certain circuits may, due to their manufacture, be incapable of meeting the high speed specifications; for these circuits, since the high performance cannot be met, fuses 32 may all be opened to minimize the Ldi/dt noise, since performance will not be an issue. Other information, such as processing parameters, test probe data (e.g., threshold voltage, transistor gain, W/L ratios), and the like may be used in order to arrive at a decision about whether or not to open all or some of fuses 32.

It should be noted that it may be preferred to have more than two groups of resistors 30a and 30b, in order to provide finer resolution in the available resistance values. In addition, it may be preferred that the values of resistors 30a and 30b be different from one another, for example having values which are binary weighted (R, R/2, R/4, R/8, etc.) to provide the finest resolution of the available resistance values for networks R5 through R8.

Alternatively to the fuses 32 shown in FIG. 4, it should be noted that the use of metal lines shorting out resistors 30 may be preferred, particularly for prototype versions of the integrated circuit. Where metal lines are used to short out resistors 30, the engineer can characterize the operation of the circuit and, by physically cutting the shorting metal lines, optimize the resistance value of networks R5 through R8 to provide the best combination of noise reduction and performance. Observation of the behavior of the circuit for each of the resistance values available can thus determine the optimum resistance value of networks R5 through R8; a metal mask revision can then be generated which maintains the shorting metal lines where desired, and open the others.

Referring now to FIG. 5, another alternative embodiment of resistor network R5 will now be described. In network R5 of FIG. 5, three series resistors 30a through 30c are connected in series between $V_{cc}$ and node PNAND. While single ones of resistors 30a through 30c are shown in FIG. 5, it is to be understood that parallel resistors thereto may be incorporated in order to reduce the current density therethrough, as described hereinabove; accordingly, resistors 30a through 30c may be considered as the single resistor equivalents of parallel resistor networks connected in series with one another.

Connected in parallel with each of resistors 30a through 30c is the source-drain path of a p-channel shorting transistor 34a through 34c, respectively. The gate of each of p-channel transistors 34 is connected to the output of an associated fuse circuit 36. Fuse circuits 36, as will be described in detail hereinbelow, provide the opposite fusing condition of that described in the alternative embodiment of FIG. 4, i.e., each of resistors 30 in FIG. 5 normally conduct current unless their associated fuse is opened to short the resistor out. It should be noted that shorting p-channel transistors 34 are used with resistor network R5 (connected between $V_{cc}$ and node PNAND), and are also preferably used with resistor network R7, so that a threshold voltage drop does not appear across a resistor 30 when its shorting transistor is turned on by the associated fuse circuit 36. Conversely, for resistor networks R6 and R8 connected between ground and nodes GNAND and GNOR, respectively, the shorting transistors are preferably n-channel transistors.

Each of fuse circuits 36 are preferably constructed in the manner shown for fuse circuit 36a of FIG. 5. A fuse 38 is connected between $V_{cc}$ and a node at the drain of an n-channel transistor 40, which is also at the input of inverter 37. The output of inverter 37 is connected to the input of an inverter 39, the output of which drives the gate of shorting p-channel transistor 34a. The output of inverter 37 is also connected to the gate of transistor 40, transistor 40 having its source biased to ground. It should be noted that the fuse circuits for resistor networks R6 and R8 which use n-channel shorting transistors to short out the resistors may be constructed identically to fuse circuit 36 of FIG. 5, with the exception that inverter 39 is not included, so that the proper logic function is performed thereby to control the n-channel shorting transistors.

In operation, with the fuse 38 intact, the input of inverter 37 will be at a high logic level near $V_{cc}$, and accordingly the output of inverter 37 will be low; transistor 40 will be off in this case. Via inverter 39, a high logic level is then driven at the gate of shorting transistor 34a, causing transistor 34a to be off. Therefore, with fuse 38 intact, transistor 34a is turned off and any current drawn through resistor network R5 will pass through resistor 30a.

If, based on test data or on product demand, it is determined that less resistance is desired in resistor network R5 so that the speed of the associated output driver circuitry can be increased, fuse 38 can be blown, for example by the application of a laser beam thereto. As the input of inverter 37 eventually discharges to ground (e.g., by way of leakage), transistor 40 will be held on as the output of inverter 37 goes to a high logic level. Inverter 39 will then drive a low logic level to the gate of transistor 34a, turning it on and shorting out resistor 30a. The resistance of resistor network R5 is thus reduced by the shorting out of resistor 30a.

Fuse circuits 36b and 36c are, of course, similarly constructed as fuse circuit 36a. In the alternative embodiment of FIG. 5, if not all of fuses 38 in fuse circuits 36 are blown, it is preferred that the fuses 38 be blown in order based on proximity to the power supply node $V_{cc}$ (e.g., fuse circuit 36a, then fuse circuit 36b, and lastly fuse circuit 36c). This prevents the situation where, if the values of resistors 30a and 30b (with their fuses 38 intact) are high enough that the voltage drop thereacross is sufficient to keep the gate-to-source voltage at transistor 34c below the threshold voltage, transistor 34c cannot turn on when its fuse 38 is blown. Conversely, for resistor networks R6 and R8 using n-channel shorting transistors, the order in which the fuses 38 would be blown would begin with the fuse circuit closest to ground.

It should be noted that the fused arrangements of FIGS. 4 and 5 are best utilized in a multiple output terminal integrated circuit, together with the shared resistor network arrangement of FIG. 2. However, the selective shorting by way of the fuses illustrated in FIGS. 4 and 5 may alternatively be used in a single output device, such as a by-one memory device, or in multiple output terminal circuits not taking advantage of the shared resistor network arrangement of FIG. 2. In such devices, while the advantages of reduced resistor area would not be obtained, the ability to adjust the speed of the output driver circuitry, traded-off against the noise generated at the output, may still be an important consideration.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. Particularly, while full CMOS output driver circuits with push-pull drivers are shown, it is contemplated that similar benefits may be obtained by use of this invention in p-channel, n-channel, or bipolar output driver circuits of various types. In addition, other types of output drivers may also benefit from this invention, including, by way of example, output drivers having open-drain or open-collector output driver configurations.

It is contemplated that such modifications and alternatives are within the scope of this invention as subsequently claimed herein.

We claim:

1. In an integrated circuit having multiple output terminals, an output driver circuit comprising:
  a plurality of output drivers, each comprising:
    a drive transistor, having a conduction path between an associated output terminal and a bias voltage, and having a control terminal; and
    a logic circuit, having an output coupled to the control terminal of said drive transistor, and having an input for receiving a data input signal to be presented at said associated output terminal, said logic circuit having first and second bias nodes;

wherein the first bias nodes of each of said logic circuits are connected together;

and further comprising:
a first resistor network coupled between said first bias nodes of said logic circuits and a first bias voltage terminal.

2. The circuit of claim 1, wherein said first resistor network comprises:
a first resistor.

3. The circuit of claim 2, wherein said first resistor network further comprises:
a second resistor connected in parallel with said first resistor.

4. The circuit of claim 2, wherein said first resistor network further comprises:
a second resistor connected in series with said first resistor.

5. The circuit of claim 4, wherein said first resistor network further comprises:
a first conductor connected in parallel with said first resistor.

6. The circuit of claim 5, wherein said first conductor comprises a first fuse.

7. The circuit of claim 5, wherein said first conductor comprises a first shorting transistor having its conduction path connected in parallel with said first resistor, and having a control terminal;
and further comprising:
a first fuse connected between a fuse bias voltage and a first node;
a first logic circuit having an input connected to said first node, and having an output connected to the control terminal of said first shorting transistor, said first logic circuit for presenting a voltage at said control terminal to turn off said first shorting transistor responsive to said first fuse being closed, and for presenting a voltage at said control terminal to turn on said first shorting transistor responsive to said first fuse being open.

8. The circuit of claim 5, further comprising:
a second conductor connected in parallel with said second resistor.

9. The circuit of claim 6, further comprising a second fuse connected in parallel with said second resistor.

10. The circuit of claim 7, further comprising a second shorting transistor having its conduction path connected in parallel with said second resistor, and having a control terminal;
and further comprising:
a second fuse connected between said fuse bias voltage and a second node;
a second logic circuit having an input connected to said second node, and having an output connected to the control terminal of said second shorting transistor, said second logic circuit for presenting a voltage at said control terminal to turn off said second shorting transistor responsive to said second fuse being closed, and for presenting a voltage at said control terminal to turn on said second shorting transistor responsive to said second fuse being open.

11. The circuit of claim 1, wherein the second bias nodes of each of said logic circuits are connected together;
and further comprising:
a second resistor network coupled between said second bias nodes of said logic circuit and a second bias voltage terminal.

12. The circuit of claim 1, wherein each of said logic circuits also have an input for receiving a disable signal;
and wherein each of said logic circuits present, at the control terminal of its associated drive transistor, a voltage to turn off said drive transistor responsive to said disable signal indicating that said output drivers are to be disabled.

13. An integrated circuit having multiple output terminals, comprising:
a plurality of output terminals;
a plurality of output driver circuits, each associated with an output terminal, and each comprising:
a pull-up transistor having its source/drain path connected between a bias voltage and its associated output terminal, and having a control terminal;
a pull-down transistor having its source/drain path connected between a reference voltage and its associated output terminal, and having a control terminal;
a first logic circuit having an input for receiving an input data signal, having a bias node and having a reference node, and having an output coupled to said control terminal of said pull-up transistor; and
a second logic circuit having an input for receiving said input data signal, having a bias node and having a reference node, and having an output coupled to said control terminal of said pull-down transistor;
a first resistor network coupled between said bias nodes of said first logic circuits of said plurality of output driver circuits and said bias voltage;
a second resistor network coupled between said reference nodes of said first logic circuits of said plurality of output driver circuits and said reference voltage;
a third resistor network coupled between said bias nodes of said second logic circuits of said plurality of output driver circuits and said bias voltage; and
a fourth resistor network coupled between said reference nodes of said second logic circuits of said plurality of output driver circuits and said reference voltage.

14. The integrated circuit of claim 13, wherein each of said resistor networks comprises:
a first resistor.

15. The integrated circuit of claim 14, wherein each of said resistor networks further comprises:
a second resistor connected in parallel with said first resistor.

16. The integrated circuit of claim 14, wherein each of said resistor networks further comprises:
a second resistor connected in series with said first resistor.

17. The circuit of claim 16, wherein each of said resistor networks further comprises:
a conductor connected in parallel with said first resistor.

18. The circuit of claim 17, wherein said conductor comprises a fuse.

19. The circuit of claim 18, wherein said conductor comprises a shorting transistor having its conduction path connected in parallel with said first resistor, and having a control terminal;
and further comprising:
a fuse connected between a fuse bias voltage and a node;

a logic circuit having an input connected to said node, and having an output connected to the control terminal of said shorting transistor, said logic circuit for presenting a voltage at said control terminal to turn off said shorting transistor responsive to said fuse being closed, and for presenting a voltage at said control terminal to turn on said shorting transistor responsive to said fuse being open.

20. A method for adjusting the switching speed of an output driver in an integrated circuit, said output driver comprising a drive transistor having a conduction path between an output terminal and a bias voltage, and having a control terminal, and a logic circuit having an output coupled to the control terminal of said drive transistor and having an input for receiving a data input signal to be presented at said associated output terminal, a first resistor network connected between a bias node of said logic circuit and a bias voltage node, and a second resistor network connected between a reference node of said logic circuit and a reference voltage node, said method comprising:

adjusting the resistance of said first resistor network.

21. The method of claim 20, wherein said first resistor network comprises a plurality of resistors in series, each having a fuse connected in parallel therewith;

and wherein said adjusting step comprises:
opening one of said fuses in said first resistor network.

22. The method of claim 20, wherein said first resistor network comprises a plurality of resistors in series, each having a fuse circuit connected in parallel therewith, said fuse circuit arranged so that, with said fuse intact, the parallel resistor is not shorted out;

and wherein said adjusting step comprises:
opening one of said fuses to short out the resistor connected in parallel with the fuse circuit in which the fuse is opened.

23. The method of claim 20, further comprising:
measuring a parameter of said circuit which is indicative of the switching speed of said circuit;
and wherein said adjusting step is performed responsive to the result of said measuring step.

24. An output driver circuit, comprising:
a drive transistor having a conduction path between an output terminal and a bias voltage, and having a control terminal;
a logic circuit having an output coupled to the control terminal of said drive transistor and having an input for receiving a data input signal to be presented at said associated output terminal;

a first resistor network connected between a bias node of said logic circuit and a bias voltage node, comprising:
a plurality of resistors connected in series between said bias voltage node and said bias node;
a plurality of conductors, each connected in parallel with one of said plurality of resistors, for allowing selection of the resistance of said first resistor network.

25. The output driver of claim 24, wherein each of said plurality of conductors comprises a fuse.

26. The output driver of claim 24, wherein each of said plurality of conductors comprises a shorting transistor having its conduction path connected in parallel with its associated parallel resistor, and each having a control terminal;

and further comprising:
a plurality of fuse circuits, each associated with a resistor, and each comprising:
a fuse; and
a logic circuit having an output coupled to the control terminal of an associated shorting transistor, said logic circuit for controlling said shorting transistor to be off responsive to said fuse being closed, and to be on responsive to said fuse being open.

27. The output driver of claim 24, further comprising:
a second resistor network connected between a reference node of said logic circuit and a reference voltage node, comprising:
a plurality of resistors connected in series between said bias voltage node and said bias node;
a plurality of conductors, each connected in parallel with one of said plurality of resistors, for allowing selection of the resistance of said first resistor network.

28. The output driver of claim 27, wherein each of said plurality of conductors comprises a fuse.

29. The output driver of claim 27, wherein each of said plurality of conductors comprises a shorting transistor having its conduction path connected in parallel with its associated parallel resistor, and each having a control terminal;

and further comprising:
a plurality of fuse circuits, each associated with a resistor, and each comprising:
a fuse; and
a logic circuit having an output coupled to the control terminal of an associated shorting transistor, said logic circuit for controlling said shorting transistor to be off responsive to said fuse being closed, and to be on responsive to said fuse being open.

* * * * *